US006765276B2

(12) United States Patent
Fasen et al.

(10) Patent No.: US 6,765,276 B2
(45) Date of Patent: Jul. 20, 2004

(54) BOTTOM ANTIREFLECTION COATING COLOR FILTER PROCESS FOR FABRICATING SOLID STATE IMAGE SENSORS

(75) Inventors: Duane Fasen, Loveland, CO (US); Jack D. Meyer, Fort Collins, CO (US); Cheryl Bailey, Fort Collins, CO (US); John H. Stanback, Fort Collins, CO (US); Kari Hansen, Fort Collins, CO (US)

(73) Assignee: Agilent Technologies, inc., Palo Alto, CA (US)

( * ) Notice: Subject to any disclaimer, the term of this patent is extended or adjusted under 35 U.S.C. 154(b) by 0 days.

(21) Appl. No.: 09/938,394

(22) Filed: Aug. 23, 2001

(65) Prior Publication Data

US 2003/0038293 A1 Feb. 27, 2003

(51) Int. Cl.[7] ................... H01L 29/18; H01L 33/00; H01L 31/0232; H01L 31/00
(52) U.S. Cl. ................. 257/437; 257/440; 257/436; 257/443; 257/88
(58) Field of Search .................... 257/79, 80, 81, 257/82, 91, 98, 88, 89, 431, 432, 435, 436, 437, 440

(56) References Cited

U.S. PATENT DOCUMENTS

| 4,782,009 A | | 11/1988 | Bolon et al. |
| 4,855,199 A | | 8/1989 | Bolon et al. |
| 5,258,608 A | | 11/1993 | Uchiya |
| 5,266,501 A | | 11/1993 | Imai |
| 5,654,202 A | * | 8/1997 | Daly et al. ............. 438/70 |
| 5,990,506 A | | 11/1999 | Fossum et al. |
| 6,048,662 A | | 4/2000 | Bruhnke et al. |
| 6,060,732 A | * | 5/2000 | Murakami et al. ......... 257/215 |
| 6,106,995 A | * | 8/2000 | Dixit et al. ............. 430/270 |
| 6,184,055 B1 | * | 2/2001 | Yang et al. .............. 438/57 |

FOREIGN PATENT DOCUMENTS

| JP | 11-103037 | 4/1999 |
| WO | WO 97/46915 | 12/1997 |

OTHER PUBLICATIONS

"Production metrology and control of color filter array photolithography for CMOS imagers," SPIE vol. 3677, pp. 326–337 (1999).
"Color filter array for CCD and CMOS image sensors using a chemically amplified, thermally cured, pre–dyed, positive–tone photoresist for 365 nm lithography," SPIE vol. 3678, pp. 1083–1090 (1999).
"Advanced complementary color filter technology without dyeing process for CCD image sensors," SPIE vol. 3333, pp. 1232–1240 (1998).

* cited by examiner

Primary Examiner—Nathan J. Flynn
Assistant Examiner—Victor A. Mandala, Jr.

(57) ABSTRACT

An image sensor system and methods of making such a system are described. The image sensor system includes a color filter array that is formed by a color filter process that incorporates a bottom antireflection coating. The bottom antireflection coating forms a protective layer that protects exposed areas of the active image sensing device structure during formation of the color filter array and, thereby, preserves the intrinsic transmission characteristics of the active image sensing device structure. The bottom antireflection coating also reduces degradation of metal structures (e.g., bonding pads) and pixel edges at the exposed surface of the active image sensing device structure. In addition, the bottom antireflection coating provides a reliable adhesive surface for the color filter array, substantially eliminating lifting of the color filter array resist structures. In some embodiments, the bottom antireflection coating also improves the optical transmission characteristics of one or more colors of the colors filter array.

11 Claims, 4 Drawing Sheets

BOTTOM ANTIREFLECTION COATING COLOR FILTER PROCESS FOR FABRICATING SOLID STATE IMAGE SENSORS

TECHNICAL FIELD

This invention relates to solid state image sensors that include color filter arrays that are formed by a bottom antireflection coating (BARC) color filter process, and methods of making the same.

BACKGROUND

In general, digital imaging systems, such as digital cameras, include image sensors (or simply imagers) for capturing images. Various types of image sensors have been developed, including charge-coupled device (CCD) image sensors and complementary metal-oxide semiconductor (CMOS) image sensors. These devices typically include an array of pixels, each of which contains a light-sensing element, such as an n+ to p-substrate photodiode, a virtual gate buried n-channel photodetector, or a photo-gate detector, which defines a light-sensing region of an image sensor. Image sensors also include circuitry for driving light signals from the light-sensing elements to other process circuitry. CCD image sensors typically include a photoelectric converter and charge accumulator for absorbing light from an object and collecting photo-generated charges into signal charge packets. In addition, CCD image sensors may include a charge transfer region for conveying charge packets from the photoelectric converter and charge accumulator, and a charge-to-voltage signal converter for generating a voltage output corresponding to the signal charge packets that are transferred through the charge transfer region. CMOS image sensors typically include an array of active pixel sensors and a row (register) of correlated double-sampling (CDS) amplifiers that sample and hold the output of a given row of pixel sensors. In both CMOS and CCD image sensor systems, each pixel sensor accumulates charge during an optical integration period in accordance with the light intensity reaching the relevant sensing area of the pixel sensor.

In color applications, each pixel sensor element typically receives light through a color filter that allows only a relatively narrow radiation wavelength range (e.g., the visible spectrum) to reach the pixel sensors of the image sensor. Multiple sets of color filters typically are arranged in a pattern of pixel size mosaics or pixel wide stripes. The color filters may be applied directly to the surface of an image sensor. Alternatively, the color filters may be formed on a passivation layer (see, e.g., U.S. Pat. No. 5,654,202), in which case a separate masking step is required to expose the bonding pads of the image sensor. The color filters typically are formed from a photoresist structure that includes a layer for each filter color. A common color filter material is spin coated-, dyed-, or pigmented-photoresist. The filter colors for a given color filter set may be additive (e.g., red, green, blue) or subtractive (e.g., cyan, magenta, yellow), or a combination of both additive and subtractive.

The light collecting efficiency of an image sensor may be improved by depositing a micro lens array over the CFA material of each pixel region. A planarization layer that is highly transmissive in the imaging wavelength range also may be deposited between the color filter array and the micro lens material.

SUMMARY

The invention features a novel image sensor system and methods of making such a system. In particular, the novel image sensor system includes a color filter array that is formed by an inventive color filter process that incorporates a bottom antireflection coating. The bottom antireflection coating forms a protective layer that protects exposed areas of the active image sensing device structure during formation of the color filter array and, thereby, preserves the intrinsic transmission characteristics of the active image sensing device structure. For example, the bottom antireflection coating protects sensitive areas of the active image sensing device structure against degradation that otherwise might be caused by exposure to developing solutions that are used to pattern the color filter array. The bottom antireflection coating also reduces degradation of metal structures (e.g., bonding pads) and pixel edges at the exposed surface of the active image sensing device structure. For example, the bottom antireflection coating reduces scumming and chemical reactions that otherwise might occur at such metal structures and pixel edges as a result of repeated exposure to color filter resist material and color filter developing solutions. In addition, the bottom antireflection coating provides a uniform adhesive surface for the color filter array, substantially eliminating lifting of the color filter array resist structures. In some embodiments, the bottom antireflection coating also improves the optical transmission characteristics of one or more colors of the colors filter array.

In one aspect of the invention, a bottom antireflection coating is formed over an exposed surface of an active image sensing device structure, a color filter array is formed on the bottom antireflection coating, and exposed portions of the bottom antireflection coating are substantially removed.

Embodiments in accordance with this aspect of the invention may include one or more of the following features.

The bottom antireflection coating may comprise a dyed organic film-forming material or a light-absorbing polymeric film-forming material.

The bottom antireflection coating preferably has a thickness that is selected to improve optical transmission characteristics of one or more colors of the color filter array. In addition, the bottom antireflection coating preferably is substantially transmissive to radiation in a wavelength range of about 400 nm to about 700 nm.

In some embodiments, the color filter array comprises a plurality of colored photoresist structures.

Exposed portions of the bottom antireflection coating preferably are removed substantially by a plasma etch process (e.g., a low-power buffered oxygen ash process). The plasma etch process preferably removes the bottom antireflection coating at a substantially higher etch rate than the color filter array.

In some embodiments, the bottom antireflection coating forms a substantially continuous layer over the exposed surface of the active image sensing device structure before exposed portions of the bottom antireflection coating are substantially removed. The bottom antireflection coating may form a protective barrier over metal structures at the exposed surface of the active image sensing device structure during formation of the color filter array.

The active image sensor device structure may be a complementary metal-oxide-semiconductor (CMOS) image sensor or a charged-coupled device (CCD) image sensor.

In another aspect, the invention features an image sensor system that includes an active image sensing device structure, a color filter array, and a bottom antireflection coating that is disposed between the color filter array and a surface of the active image sensing device structure.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
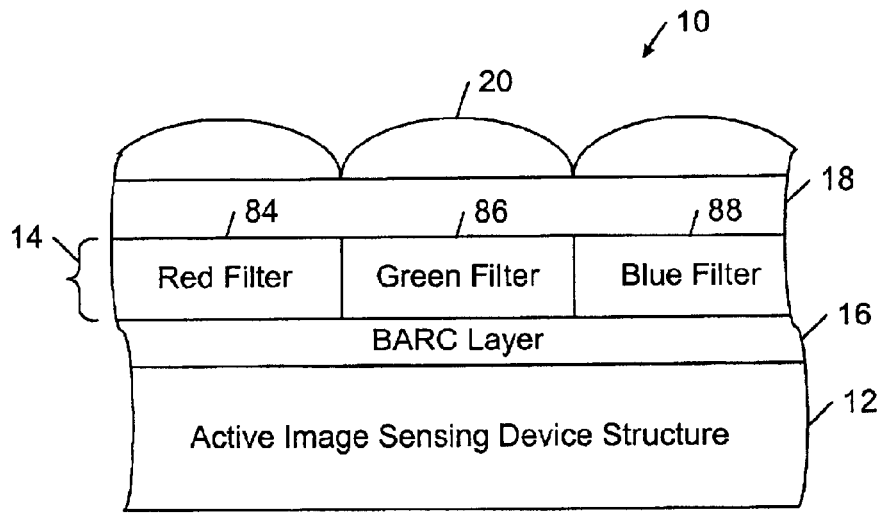
FIG. 1 is a block diagram of a portion of an image sensor system that includes a bottom antireflection coating disposed between a color filter array and a top surface of an active image sensing device structure.

Referring to FIG. 1, in one embodiment, an image sensor system 10 includes an active image sensing device structure 12, a color filter array 14, and a bottom antireflection coating (BARC) layer 16 disposed between a top surface of active image sensing device structure 12 and color filter array 14. Image sensor system 10 also includes a passivation layer 18 and a conventional micro lens array 20 that is formed over passivation layer 18.

Figure 2:
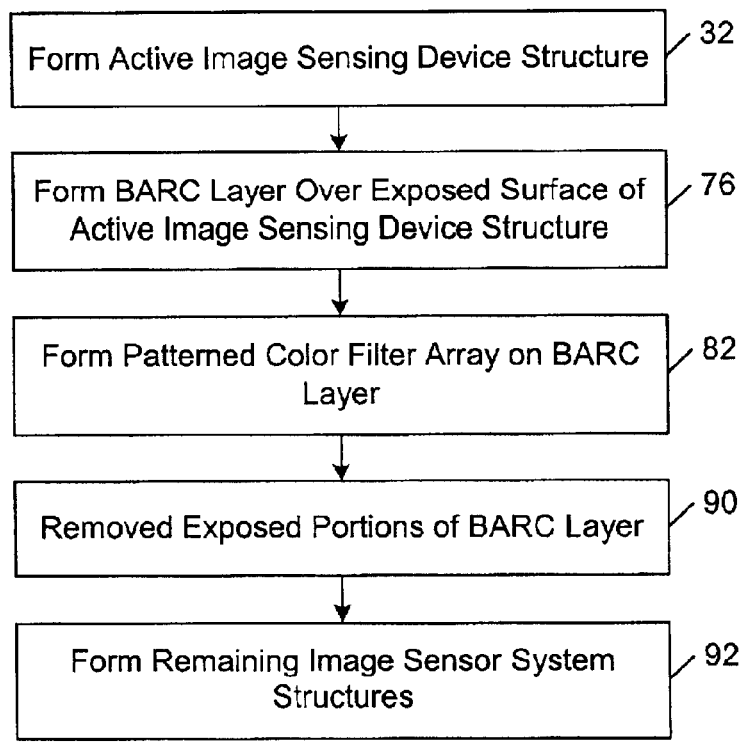
FIG. 2 is a flow diagram of a process of fabricating the image sensor system of FIG. 1.
Figure 3:
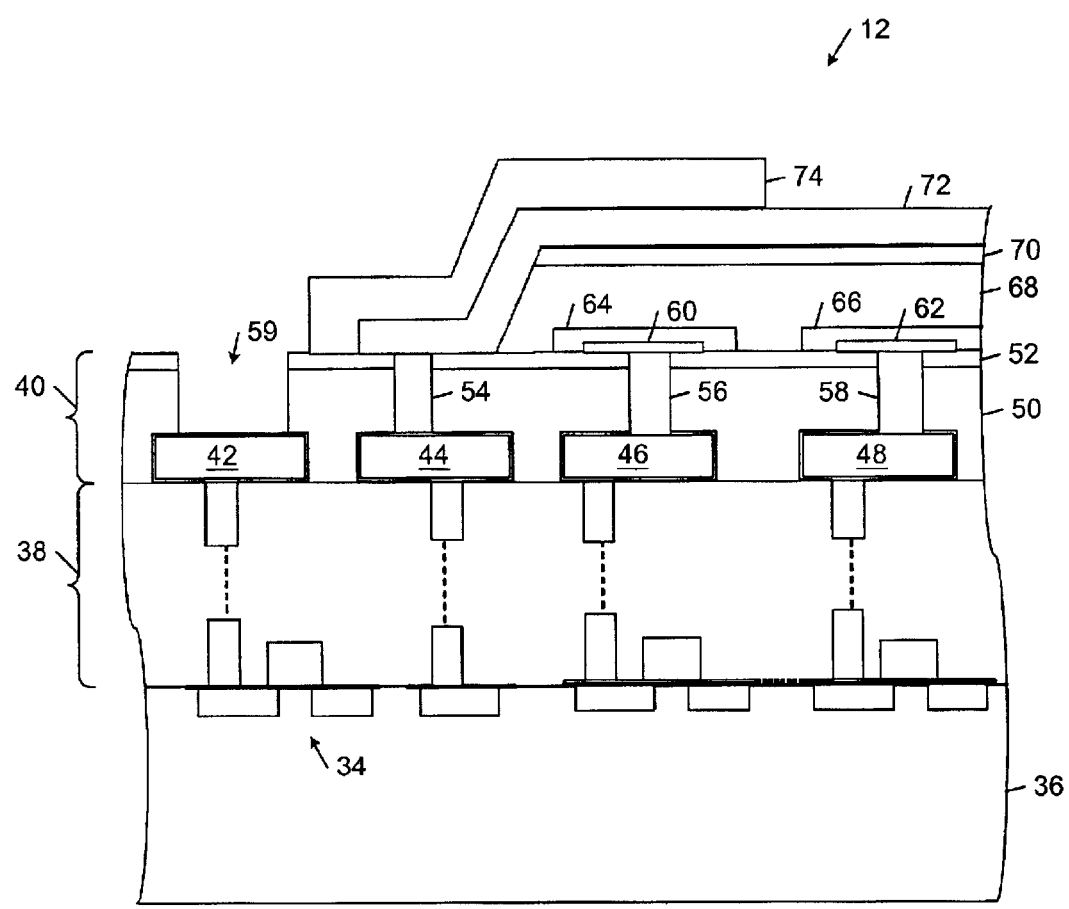
FIG. 3 is a diagrammatic cross-sectional side view of an image sensor system being formed in accordance with the process of FIG. 2 after an active image sensing device structure has been formed.

Referring to FIGS. 2, 3, 4 and 5, and initially to FIGS. 2 and 3, image sensor system 10 may be formed as follows. An active image sensing device structure 12 initially is formed (step 32). Active image sensing device structure 12 may be a conventional CCD imaging device structure or a conventional CMOS imaging device structure. In general, active image sensing device structure 12 may include an array of pixels, each of which contains a light-sensing element (e.g., a p-i-n photodiode, an n+ to p-substrate photodiode, a virtual gate buried n-channel photodetector, or a photo-gate detector), and circuitry for driving light signals from the light-sensing elements to other process circuitry.

As shown in FIG. 3, in one embodiment, active image sensing device structure 12 includes a plurality of pixel transistors 34 that are formed on a substrate 36, a number of metallization interconnect levels 38 (not shown individually), and a final metallization level 40. Final metallization level 40 includes a bonding pad 42, a ground contact 44, and a pair of metallization contacts 46, 48. Final metallization level 40 also includes a polished oxide (e.g., silicon oxide) layer 50, a silicon nitride layer 52, and a number of tungsten-filled contact vias 54, 56, 58 extending through oxide and silicon nitride layers 50, 52 down to a respective contact 44–48. A Ti/TiN barrier (or liner) layer may be deposited on the surfaces of contact vias 54–58 before the tungsten plugs are formed. A via 59 is formed through oxide and silicon nitride layers 50, 52 to expose bonding pad 42. A pixel metallization 60, 62 may be formed over each of the tungsten plugs 56, 58 that are connected to metallization contacts 46, 48. Patterned n-type amorphous silicon layers 64, 66 are formed over the pixel metallizations 60, 62. An intrinsic amorphous silicon layer 68 is formed over n-type amorphous silicon layers 64, 66, and a p-type amorphous silicon layer 70 is formed over the intrinsic amorphous silicon layer 68. A transparent conductive layer 72 extends over p-type amorphous silicon layer 70 and contacts the tungsten plug connected to ground contact 44. An opaque metal layer 74 extends over a portion of transparent conductive layer 72 to bridge transparent conductive layer 72 at the ground contact perimeter, blocks light at pixel borders, and surrounds the pixel array.

Figure 4:
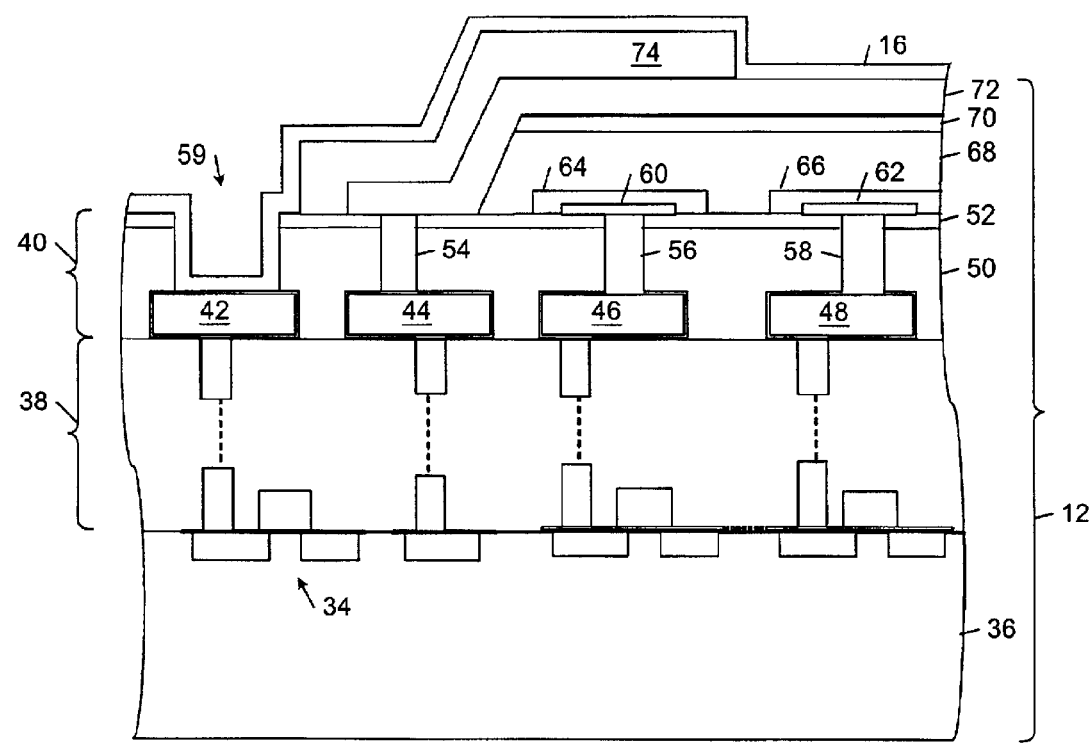
FIG. 4 is a diagrammatic cross-sectional side view of an image sensor system being formed in accordance with the process of FIG. 2 after a bottom antireflection coating has been formed over an exposed surface of the active image sensing device structure of FIG. 3.

As shown in FIG. 4, after active image sensing device structure 12 is formed (step 32; FIG. 2), a BARC layer 16 is deposited over an exposed surface of active image sensing device structure 12 (step 76; FIG. 2). In general, BARC layer 16 may be formed from any conventional BARC material, including a dyed organic film-forming BARC material or a light-absorbing polymeric film-forming BARC material. In some embodiments, BARC layer 16 preferably is substantially absorptive of radiation in the wavelength range used to pattern color filter array 14 and is substantially transmissive to radiation in the wavelength range to be imaged by image sensor system 10 (e.g., the visible radiation spectrum). BARC layer 16 may be formed from an organic film-forming material or a polymeric film-forming material. In one embodiment, BARC layer 16 is a photoresist-based antireflective coating that is substantially transmissive to radiation in a wavelength range of about 400 nm to about 700 nm (e.g., a Shipley AR2-600 antireflection coating, which is available from Shipley Company, L. L. C. of Marlborough, Mass., U.S.A.). In this embodiment, BARC layer 16 may be applied by a conventional spin-coater operating at 2000 rpm during deposition and at 4790 rpm during spreading; the resulting BARC layer 16 has a thickness of about 60 nm. After deposition, BARC layer 16 is exposed to a 60 second proximity bake at 205° C. on a DNS track.

In general, BARC layer 16 may have a thickness that is selected to improve the optical transmission characteristics of one or more colors of color filter array 14. In particular, the BARC layer thickness may be selected so that the peak transmission at one or more target radiation wavelengths is increased relative to device structures that do not include BARC layer 16. The target radiation wavelengths may correspond to the wavelengths of peak pixel sensitivity for each color of the color filter set of the completed image sensor system 10. The optical transmission characteristics for each color may be modeled based upon the refraction indices of BARC layer 16 and the other layers of image sensing device structure 12. The thicknesses of BARC layer 16 and the layers of color filter array 14 may be varied within specified thickness ranges until the peak transmissions for one or more of the target radiation wavelengths of the color filter set are optimized. In the illustrated embodiment, it has been discovered that a BARC layer thickness of approximately 60 nm improves the optical transmission characteristics for each of the colors of an RGB color filter array at the target radiation wavelengths of 620 nm for red, 540 nm for green, and 460 nm for blue. In general, the BARC layer thickness should be relatively thin (e.g., less than approximately 200 nm) so that portions of BARC layer 16 may be removed relatively easily to expose bonding pad 42 and other device structures during the BARC layer removal process step (described below in connection with process step 90 of FIG. 2).

Figure 5:
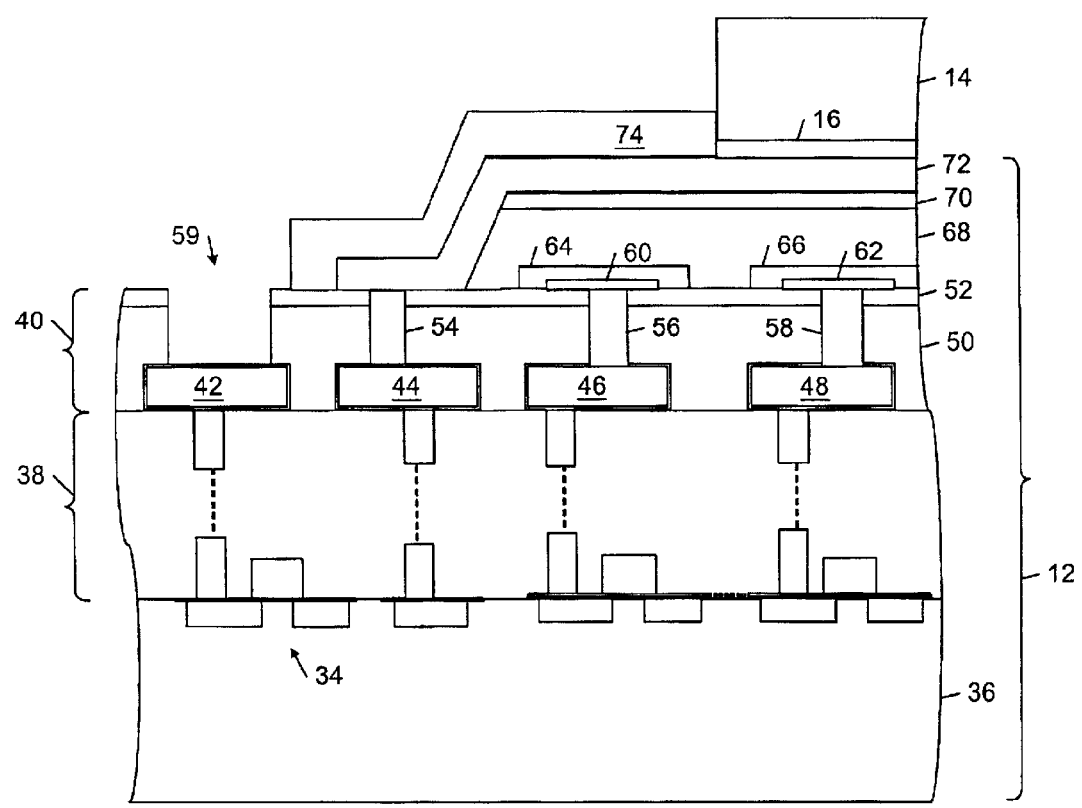
FIG. 5 is a diagrammatic cross-sectional side view of an image sensor system being formed in accordance with the process of FIG. 2 after a color filter array has been formed on the bottom antireflection coating of FIG. 4 and exposed portions of the bottom antireflection coating have been removed.

Referring to FIG. 5, a patterned color filter array 14 is formed on BARC layer 16 (step 82; FIG. 2). BARC layer 16 provides a reliable adhesive surface for the color filter array 14 and, thereby, substantially eliminates lifting of the color filter array resist structures. Color filter array 14 may be a conventional color filter array that is formed from a plurality of colored photoresist structures that are arranged in a pattern of pixel size mosaics or pixel wide stripes. For example, color filter array 14 may be polymer color filter array that is formed by successive deposition of the colored photoresist layers of a particular color set (e.g., red/green/blue or cyan/magenta/yellow). A masking or etching process may be used to form a respective color filter at a selected pixel location. In general, a pixel color filter may be formed from a single polymer layer containing one or several dyes, or by several polymer layers, each of which contains one or more dyes. As shown in FIG. 1, the resulting color filter array 14 includes a distinct, spatially separated filter region 84, 86, 88 for each filter color (e.g., red, green and blue in the illustrated embodiment), each region 84, 86, 88 corresponding to a different color pixel of image sensor system 10. By this arrangement, light at different wavelengths may be sampled separately so that color-separated images may be formed.

As explained above, BARC layer 16 protects exposed areas of the active image sensing device structure 12 during formation of the color filter array 14 and, thereby, preserves the intrinsic transmission characteristics of the active image sensing device structure 12. For example, BARC layer 16 protects sensitive areas of active image sensing device structure 12 against degradation that otherwise might be caused by exposure to the developing solutions that are used to pattern the color filter array 14. The bottom antireflection coating also reduces degradation of metal structures (e.g., bonding pad 42) and pixel edges at the exposed surface of the active image sensing device structure 12. For example, BARC layer 16 reduces scumming and chemical reactions that otherwise might occur at such metal structures and pixel edges as a result of repeated exposure to color filter resist material and color filter developing solutions.

Next, exposed portions of BARC layer 16 are removed (step 90; FIG. 2). BARC layer 16 may be removed in a conventional plasma etch system (e.g., a LAM590 plasma etch system available from LAM Research Corporation of Fremont, Calif.). In one embodiment, a low-power buffered ash (e.g., a He/O$_2$ ash) may be used to remove BARC layer 16. The plasma etch process preferably removes BARC layer 16 at a substantially higher etch rate than the color filter array 14. It has been discovered that the process of removing portions of BARC layer 16 also improves the optical transmission characteristics of color filter array 14 by removing (or cleaning) portions of color filter array 14 that are stained during formation of color filter array 14. For example, during formation of an RGB color filter array, the array of filters for the first color (e.g., red) that is formed may be stained by the subsequent color resist processing steps that are used to form the filter arrays for the remaining colors (e.g., blue and green). In addition, the array of filters for the second color (e.g., blue) that is formed may be stained by the subsequent color resist processing steps that are used to form the filter array for the remaining color (e.g., green). Such staining reduces the optical transmission through the stained color filter arrays. The process of removing portions of BARC layer 16, however, cleans the surfaces of the stained color filter arrays and, thereby, improves their optical transmission characteristics.

Additional structures, including passivation layer 18 and micro lens array 20, may be formed after the exposed portions of BARC layer 16 have been removed (step 92; FIG. 2). These additional structures may be formed in accordance with conventional device fabrication processes.

Other embodiments are within the scope of the claims.

What is claimed is:

1. An image sensor system, comprising:
   an active image sensing device structure comprising an array of light sensing elements;
   a color filter array comprising an array of color filters each disposed over a respective light sensing element, wherein light travels from each color filter to a respective light sensing element through a respective light transmission path substantially transmissive to radiation in a visible wavelength range; and
   a bottom antireflection coating disposed in each light transmission path between the color filter array and the active image sensing device structure, wherein the bottom antireflection coating has a thickness less than approximately 200 nm.

2. The system of claim 1, wherein the bottom antireflection coating comprises a dyed organic film-forming material.

3. The system of claim 1, wherein the bottom antireflection coating comprises a light-absorbing polymeric film-forming material.

4. The system of claim 1, wherein the bottom antireflection coating has a thickness selected to improve an optical transmission characteristic of one or more colors of the color filter array.

5. The system of claim 1, wherein the bottom antireflection coating is substantially transmissive to radiation in a wavelength range of about 400 nm to about 700 nm.

6. The system of claim 1, wherein the color filter array comprises a plurality of colored photoresist structures.

7. The system of claim 1, wherein the bottom antireflection coating has a substantially higher plasma etch rate than the color filter array.

8. The system of claim 1, wherein the active image sensor device structure comprises a complementary metal-oxide-semiconductor (CMOS) image sensor.

9. The system of claim 1, wherein the bottom antireflection coating has a thickness of about 60 nm.

10. The system of claim 1, wherein the bottom antireflection coating is present only in regions directly under color filter array material.

11. The system of claim 1, wherein the color filter array is formed directly on bottom antireflection coating material.

* * * * *